US009305706B2

(12) United States Patent
Almadhoun et al.

(10) Patent No.: US 9,305,706 B2
(45) Date of Patent: Apr. 5, 2016

(54) FRACTIONAL ORDER CAPACITOR

(71) Applicant: Saudi Basic Industries Corporation, Riyadh (SA)

(72) Inventors: Mahmoud N. Almadhoun, Thuwal (SA); Amro Elshurafa, Thuwal (SA); Khaled Salama, Thuwal (SA); Husam Alshareef, Thuwal (SA)

(73) Assignee: Saudi Basic Industries Corporation, Riyadh (SA)

( * ) Notice: Subject to any disclaimer, the term of this patent is extended or adjusted under 35 U.S.C. 154(b) by 216 days.

(21) Appl. No.: 14/199,296

(22) Filed: Mar. 6, 2014

(65) Prior Publication Data

US 2014/0266374 A1 Sep. 18, 2014

Related U.S. Application Data

(60) Provisional application No. 61/783,373, filed on Mar. 14, 2013.

(51) Int. Cl.
| H01G 4/06 | (2006.01) |
| H01G 4/005 | (2006.01) |
| H03K 5/14 | (2014.01) |
| H05K 1/18 | (2006.01) |

(Continued)

(52) U.S. Cl.
CPC .............. *H01G 4/005* (2013.01); *H01G 4/206* (2013.01); *H03K 5/14* (2013.01); *H05K 1/182* (2013.01); *B82Y 30/00* (2013.01)

(58) Field of Classification Search
CPC ......... H01G 11/48; H01G 11/56; H01G 9/15; H01G 4/206; H01G 9/042; H01G 4/30; H01G 9/045; H01G 11/36; H01G 4/005; H01G 4/06; H01G 4/08; H01G 4/12; H01G 4/14; H01G 4/20
See application file for complete search history.

(56) References Cited

U.S. PATENT DOCUMENTS

| 6,444,478 B1 * | 9/2002 | Basceri ................. C23C 16/409 |
| | | 257/E21.01 |
| 7,623,340 B1 | 11/2009 | Song et al. ................... 361/502 |
| 7,875,219 B2 | 1/2011 | Zhamu et al. ................ 264/29.1 |

(Continued)

FOREIGN PATENT DOCUMENTS

| CN | 101882480 | 11/2010 |
| CN | 102496481 | 6/2012 |

(Continued)

OTHER PUBLICATIONS

Romasanta, Laura J. et al., Functionalised Graphene Sheets as Effective High Dielectric Constant Fillers, Aug. 25, 2011, Nanoscale Research Letters 6:508.*

(Continued)

*Primary Examiner* — Dion R Ferguson
(74) *Attorney, Agent, or Firm* — Norton Rose Fulbright US LLP

(57) ABSTRACT

Disclosed is a fractional order capacitor comprising a dielectric nanocomposite layer of thickness t, comprising a first side, and a second side opposite the first side, a first electrode layer coupled to the first side of the dielectric nanocomposite layer, a second electrode layer coupled to the second side of the dielectric nanocomposite layer, a complex impedance phase angle dependent on at least a material weight percentage of filler material in a dielectric nanocomposite layer.

21 Claims, 7 Drawing Sheets

(51) Int. Cl.
*H01G 4/20* (2006.01)
*B82Y 30/00* (2011.01)

(56) References Cited

U.S. PATENT DOCUMENTS

| | | | | |
|---|---|---|---|---|
| 2007/0030623 | A1* | 2/2007 | Clemens | H01G 9/028 361/281 |
| 2011/0180140 | A1 | 7/2011 | Zhai et al. | 136/256 |
| 2012/0282527 | A1 | 11/2012 | Amine et al. | 429/231.8 |

FOREIGN PATENT DOCUMENTS

| | | |
|---|---|---|
| CN | 102509642 | 6/2012 |
| CN | 102530931 | 7/2012 |
| CN | 102604275 | 7/2012 |
| CN | 102627768 | 8/2012 |
| JP | 2012-088476 | 10/2012 |
| JP | 2012-188476 | 10/2012 |
| KR | 2010-0012583 | 2/2010 |
| WO | WO 2012-055095 | 5/2012 |
| WO | WO 2012-177555 | 12/2012 |

OTHER PUBLICATIONS

International Search Report & Written Opinion issued in PCT/US2014/021173, dated Aug. 18, 2014.
K. Biswas et al. "Modeling of a capacitive probe in a polarization medium," Sensors and Actuators A: Physical, vol. 120, pp. 115-122, 2005.
K. Biswas et al. "Realization of a constant phase element and its performance study in a differentiator circuit," Circuits and Systems II: Express Briefs, IEEE Transactions on, vol. 53, pp. 802-806, 2006.
D. Mondal et al. "Performance study of fractional order integrator using single-component fractional order element," Circuits, Devices & Systems, IET, vol. 5, pp. 334-342, 2011.
I. S. Jesus et al. "Development of fractional order capacitors based on electrolyte processes," Nonlinear Dynamics, vol. 56, pp. 45-55, 2009.
I. S. Jesus et al. "Fractional order capacitors," in Proc. 27$^{th}$ IASTED International Conference on Modeling, Identification and Control, Austria, 2008.
D. Mondal et al. "Packaging of Single Component Fractional Order Element." IEEE Transactions on Device and Material Reliability, Accepted.
T. Cisse Haba et al. "Influence of the electrical parameters on the input impedance of a fractal structure realized on silicon." Chaos Solitons & Fractals, vol. 24, pp. 479-490, 2005.
T. C. Haba et al. "An analytical expression for the input impedance of a fractal tree obtained by a microelectronical process and experimental measurements of its non-integral dimension." Chaos, Solitons & Fractals, vol. 33, pp. 364-373, 2007.
T. C. Haba et al. "Use of a Component with Fractional Impedance in the Realization of an Analogical Regulator of Order ½." Journal of Applied Sciences, vol. 8, pp. 59-67, 2008.
S. Tu et al. "Realization of fractional-order capacitors with field effect transistors." World academy of science, Engineering, and technology, vol. 71, pp. 778-781, 2012.
J. Liu et al. "Solvation induced morphological effects on the polymer/metal contacts." Journal of Applied Physics. vol. 89, No. 7, pp. 3668-3673. 2001.
F. Alvi et al. "Graphene-Polythiophene Nanocomposite as Novel Supercapacitor Electrode Material." Journal of New Materials for Electrochemical Systems 15, 89-95. 2012.
H. Gomez et al. "Graphene-conducting polymer nanocomposite as novel electrode for supercapacitors." Journal of Power Sources 196, pp. 4102-4108. 2011.
Jaidev et al. "Poly (p-phenylenediamine)/grapheme nanocomposites for supercapacitor applications." Journal of Materials Chemistry, 22, pp. 18775-18783. 2012.
M. A. Khan et al. "Fabrication and characterization of all-polymer, transparent ferroelectric capacitors on flexible substrates." Organic Electronics, vol. 12, pp. 2225-2229. 2011.

* cited by examiner

FRACTIONAL ORDER CAPACITOR

CROSS REFERENCE TO RELATED APPLICATIONS

This application claims the benefit of U.S. Provisional Patent Application No. 61/783,373, filed Mar. 14, 2013. The contents of the referenced application(s) is incorporated into the present application by reference.

BACKGROUND OF THE INVENTION

A. Field of the Invention

The present disclosure generally relates to fractional order capacitors having improved control over capacitor characteristics, including the complex impedance phase angle. The capacitors have a dielectric nanocomposite layer with filler material which allows for improved control over the capacitor characteristics.

B. Description of Related Art

Historically, fractional order calculus has been unexplored in engineering, because of its complexity and the fact that it did not have a fully acceptable geometrical or physical realization. For example, electrical components are generally limited to the specific characteristics of ideal inductors, resistors, and capacitors which have $\alpha$ values of −1, 0, and 1 respectively. In this context, $\alpha$ may be used to determine the phase shift between a device's current and its voltage through the equation $-\alpha\pi/2$. When converted to degrees, i.e. 90, 0 and −90, these values represent the complex impedance phase angle.

However, since electrical components do not have exact integer values of a when implemented in real applications, having the ability to intentionally control the value of $\alpha$ somewhere between the characteristics of the standard components may be useful for a variety of applications including performing automatic control, pattern recognition, system characterization, signal processing, and applying filters and oscillators related to the fields of electrochemistry, viscoelasticity, and even biological and neural systems.

Previous attempts to intentionally design electrical components with specific $\alpha$ values within the range $0<\alpha<1$, have generally resulted in very bulky designs that in many cases are not usable or practical in real applications or circuits. For example, with respect to liquid-electrode-based (LEB) type fractional capacitors, copper electrodes are immersed in a PMMA-choloroform solution, and the phase angle is varied depending on the depth of immersion of the electrodes. However, this method clearly does not allow integration with printed circuit boards and/or electronic circuits easily. Moreover, packaging of such a setup results in a very bulky apparatus.

Other attempts have included fractal-type (FT) fractional capacitors designs. These designs are typically created on wafers and rely on transmission line theory. The basic operating principle behind these types of capacitors involves creating fractal geometries as stubs, or transmission lines, which in turn can yield a specific impedance based on the geometry and the technological parameters. Instead of creating a capacitor, the FT uses a series of metal traces that are created on the circuit to create the impedance. This is often referred to as a distributed element design as opposed to a lumped element design. Moreover, when using FT fractional capacitor, the values of $\alpha$ that can be achieved are only in the range of 0.46-0.5. Further, the constant phase behavior occurs at very high frequency ranges (1 MHz-10 GHz) given the nature of microwave circuits, and the variation in the phase angle is around 5°.

Other approaches have included simulating by digitally approximating the fractional order problems and calculating approximate solutions. Digital approximations are necessarily limited in bandwidth, highly consumptive of computer resources, and can suffer from numerical instabilities due to finite precision arithmetic. These limitations can make digital techniques impractical or incapable of solving many problems, such as controlling fast processes or "stiff" processes, which involve strong opposing forces.

SUMMARY OF THE INVENTION

The present inventors have discovered that the weight percentage of a two-dimensional nano-material, also described as filler material, can be used to control the complex impedance angle of a capacitor. Specifically, a capacitor's dielectric layer can be formed by selecting a certain weight percentage of a filler material, such as graphene based on its combination in a polymer matrix. The weight percentage can be used to select any non-integer values for $\alpha$ within the range $0<\alpha<1$, which directly alters the complex impedance phase angle of a capacitor as described above.

One of the unique aspects of using graphene as the two-dimensional nano-material, involves the formation of micro-capacitors within the dielectric layer. Specifically, fractional capacitance is controlled by the loading of the graphene sheets in the polymer matrix leading to the formation of dispersed micro-capacitors. This closely resembles RC ladder networks used in simulations and allows tuning the values of $\alpha$ without the need for complex and bulky circuit designs. Graphene also has unique properties that encourage the free flow of electrons at ultra-high speeds.

Further, the fabrication of fractional order capacitors of the present invention are scalable and cost-effective allowing for effective fabrication and commercialization.

According to one aspect of the disclosure, a fractional order capacitor includes a dielectric nanocomposite layer of thickness t and includes a first side, and a second side opposite the first side. The fractional order capacitor further includes a first electrode layer coupled to the first side of the dielectric nanocomposite layer and a second electrode layer coupled to the second side of the dielectric nanocomposite layer. The fractional order capacitor also includes a complex impedance phase angle dependent on at least a material weight percentage of filler material in a dielectric nanocomposite layer.

According to another aspect of the disclosure, the dielectric nanocomposite layer of the fractional order capacitor includes a matrix material and a conductive filler material where the matrix material is a polymer and the conductive filler material is graphene. The graphene may be partially oxidized or completely un-oxidized. In addition, the material weight percentage of the graphene is between about 0.1% and 15%, based upon the total weight of the dielectric nanocomposite layer.

According to yet another aspect of the disclosure, the first and second electrode layers of the fractional order capacitor includes a conducting material. The first electrode layer includes platinum and the second electrode layer comprises aluminum. The first and second electrode layers may alternatively include PEDOT:PSS.

According to a further aspect of the disclosure, the fractional order capacitor includes a complex impedance phase angle between 0° and −90°, or includes a loss tangent approximately constant with respect to frequency, or exhibits fractional behavior for frequencies between 10 kHz and 2 MHz.

According to another aspect of the disclosure, the fractional order capacitor may be included in a printed circuit board or integrated circuit and used in at least a portion of a communications circuit, or a sensing circuit, or a control circuit. The fractional order capacitor may also be included in an electronic device.

According to yet another aspect of the disclosure, a method for manufacturing a fractional order capacitor includes obtaining a first electrode layer. The method also includes selecting a material weight percentage of a filler material in a dielectric nanocomposite layer to achieve a specified complex impedance phase angle. The method further includes disposing the dielectric nanocomposite layer on the first electrode layer. The method also includes disposing a second electrode layer on the dielectric nanocomposite layer so that the dielectric nanocomposite layer is disposed between the first electrode layer and the second electrode layer.

According to a further aspect of the disclosure, the dielectric nanocomposite layer of the fractional order capacitor may be manufactured with a matrix material and a conductive filler material where the matrix material is a polymer and the conductive filler material is graphene. The graphene may be partially oxidized or completely un-oxidized. In addition, the material weight percentage of the graphene is between about 0.1% and 15%, based upon the total weight of the dielectric nanocomposite layer. In addition, the fractional order capacitor includes a complex impedance phase angle between 0° and −90°, or includes a loss tangent approximately constant with respect to frequency, or exhibits fractional behavior for frequencies between 10 kHz and 2 MHz.

According to another aspect of the disclosure, the fractional order capacitor may be manufactured with first and second electrode layers that include a conducting material. The first electrode layer includes platinum and the second electrode layer comprises aluminum. The first and second electrode layers may alternatively include PEDOT:PSS.

According to yet another aspect of the disclosure, the dielectric nanocomposite layer of the fractional order capacitor may be disposed on the first electrode layer by solution casting, by a doctor blade, or by tape casting, or by silk-screen printing, or by hot pressing. The second electrode layer is thermally-evaporated on the dielectric nanocomposite layer using a shadow-mask. According to another aspect of the disclosure, the fractional order capacitor may be packaged in a printed circuit board or integrated circuit.

According to a further aspect of the disclosure, a method of operating a delay circuit to impose a selected delay on an electrical signal with any one of the fractional order capacitors of the present invention includes selecting a material weight percentage of a filler material in a dielectric nanocomposite layer of the fractional order capacitor to achieve a specified complex impedance phase angle. The method also includes charging said fractional order capacitor to a first voltage at a rate of charge responsive to the input signal. The method further includes discharging said fractional order capacitor to a second voltage at a rate of discharge responsive to the input signal. The method also includes producing a delayed signal, as a function of the complex impedance phase angle of said fractional order capacitor.

According to a further aspect of the disclosure, a method for adjusting a frequency response of a filter which includes a resistor and any one of the fractional order capacitors of the present invention, includes selecting a material weight percentage of a filler material in a dielectric nanocomposite layer of the fractional order capacitor to achieve a specified complex impedance phase angle. The method also includes supplying an input voltage across a series combination of the fractional capacitor and a resistor. The method further includes supplying an output voltage based on the voltage across the resistor. The method also includes measuring a gain of the filter at a particular frequency. The method further includes adjusting a capacitance of the fractional order capacitor according to the gain of the filter at the particular frequency by varying the complex impedance phase angle.

According to another aspect of the disclosure, a method of operating a RF communications circuit which includes any one of the fractional order capacitors of the present invention, includes selecting a material weight percentage of a filler material in a dielectric nanocomposite layer of the fractional order capacitor to achieve a specified complex impedance phase angle. The method also includes generating an RF signal at a resonant frequency. The method further includes detecting a series resistance value of other components in the RF communications circuit. The method also includes setting a negative resistance value of the fractional order capacitor to offset at least some of an equivalent series resistance value of other components in the RF communications circuit by varying the complex impedance phase angle.

Also disclosed are the following embodiments 1 to 44 of the present invention. Embodiments 1 is a fractional order capacitor comprising: a dielectric nanocomposite layer of thickness t, comprising a first side, and a second side opposite the first side; a first electrode layer coupled to the first side of the dielectric nanocomposite layer; a second electrode layer coupled to the second side of the dielectric nanocomposite layer; and a complex impedance phase angle dependent on at least a material weight percentage of filler material in a dielectric nanocomposite layer. Embodiment 2 is the fractional order capacitor of Embodiment 1 where the dielectric nanocomposite layer comprises a matrix material and a conductive filler material. Embodiment 3 is the fractional order capacitor of Embodiment 2 where the conductive filler material is graphene. Embodiment 4 is the fractional order capacitor of Embodiment 3 where the graphene is partially oxidized. Embodiment 5 is the fractional order capacitor of Embodiment 3 where the graphene is completely un-oxidized. Embodiment 6 is the fractional order capacitor of any one of Embodiments 3 to 5 where the material weight percentage of the graphene comprises between about 0.1% and 15%, based upon the total weight of the dielectric nanocomposite layer. Embodiment 7 is the fractional order capacitor of any one of Embodiments 2 to 6 where the matrix material comprises a polymer. Embodiment 8 is the fractional order capacitor of any one of Embodiments 1 to 7 where the first and second electrode layers comprise a conducting material. Embodiment 9 is the fractional order capacitor of Embodiment 8 where the first electrode layer comprises platinum and the second electrode layer comprises aluminum. Embodiment 10 is the fractional order capacitor of Embodiment 8 where the first and second electrode layers comprise PEDOT:PSS. Embodiment 11 is the fractional order capacitor of any one of Embodiments 1 to 10 comprising a complex impedance phase angle between 0° and −90°. Embodiment 12 is the fractional order capacitor of any one of Embodiments 1 to 11 comprising a loss tangent approximately constant with respect to frequency. Embodiment 13 is the fractional order capacitor of any one of Embodiments 1 to 13 wherein the fractional order capacitor exhibits fractional behavior for frequencies between 10 kHz and 2 MHz. Embodiment 14 is a printed circuit board comprising the fractional order capacitor of any one of Embodiments 1 to 13. Embodiment 15 is an integrated circuit comprising the fractional order capacitor of any one of Embodiments 1 to 13. Embodiment 16 is the printed circuit board of Embodiment 14 where the fractional order capacitor comprises at least a portion of a communications circuit. Embodiment 17 is the printed circuit board of Embodiment 14 where the fractional order capacitor comprises at least a portion of a sensing circuit. Embodiment 18 is the printed circuit board of Embodiment 14 where the fractional order capacitor comprises at least a portion of a control circuit. Embodiment 19 is the integrated circuit of Embodiment 15 where the fractional order capacitor comprises at least a portion of a communications circuit. Embodiment 20 is the integrated circuit of Embodiment 15 where the fractional order capacitor comprises at least a portion of a sensing circuit. Embodiment 21 is the integrated circuit of Embodiment 15 where the fractional order capacitor comprises at least a portion of a control circuit. Embodiment 22 is an electronic device comprising the fractional order capacitor of any one of embodiments 1 to 13. Embodiment 23 is a method of manufacturing a fractional order capacitor, comprising: obtaining a first electrode layer; selecting a material weight percentage of a filler material in a dielectric nanocomposite layer to achieve a specified complex impedance phase angle; disposing the dielectric nanocomposite layer on the first electrode layer; and disposing a second electrode layer on the dielectric nanocomposite layer so that the dielectric nanocomposite layer is disposed between the first electrode layer and the second electrode layer. Embodiment 24 is the method of Embodiment 23 where the dielectric nanocomposite layer comprises at least a matrix material and a conductive filler material. Embodiment 25 is the method of Embodiment 24 where the conductive filler material is graphene. Embodiment 26 is the method of Embodiment 25 where the graphene is partially oxidized. Embodiment 27 is the method of Embodiment 25 where the graphene is completely un-oxidized. Embodiment 28 is the method of any one of Embodiments 25 to 27 where the material weight percentage of the graphene is selected between about 0.1% and 15%, based upon the total weight of the dielectric nanocomposite layer. Embodiment 29 is the method of any one of Embodiments 24 to 28 where the matrix material comprises a polymer. Embodiment 30 is the method of any one of Embodiments 23 to 29 where the first and second electrode layers comprise a conducting material. Embodiment 31 is the method of Embodiment 30 where the first electrode layer comprises platinum and the second electrode layer comprises aluminum. Embodiment 32 is the method of Embodiment 30 where the first and second electrode layers comprises PEDOT:PSS. Embodiment 33 is the method of any one of Embodiments 23 to 32 where the dielectric nanocomposite layer is disposed on the first electrode layer by solution casting. Embodiment 34 is the method of any one of Embodiments 23 to 33 where the dielectric nanocomposite layer is disposed on the first electrode layer by a doctor blade. Embodiment 35 is the method of any one of Embodiments 23 to 34 where the dielectric nanocomposite layer is disposed on the first electrode layer by tape casting. Embodiment 36 is the method of any one of Embodiments 23 to 35 where the dielectric nanocomposite layer is disposed on the first electrode layer by silk-screen printing. Embodiment 37 is the method of any one of Embodiments 23 to 36 where the dielectric nanocomposite layer is disposed on the first electrode layer by hot pressing. Embodiment 38 is the method of any one of Embodiments 23 to 37 where the second electrode layer is thermally-evaporated on the dielectric nanocomposite layer using one a shadow-mask. Embodiment 39 is the method of any one of Embodiments 23 to 38 where the complex impedance phase angle is between 0° and −90°. Embodiment 40 is the method of any one of Embodiments 23 to 39 additionally comprising the steps of packaging the fractional order capacitor in an integrated circuit. Embodiment 41 is the method of any one of Embodiments 23 to 40 additionally comprising the steps of packaging the fractional order capacitor in a printed circuit board. Embodiment 42 is a method of operating a delay circuit to impose a selected delay on an electrical signal with any one of the fractional order capacitors from Embodiments 1 to 13, the method comprising the steps of: selecting a material weight percentage of a filler material in a dielectric nanocomposite layer of the fractional order capacitor to achieve a specified complex impedance phase angle; charging said fractional order capacitor to a first voltage at a rate of charge responsive to the input signal; discharging said fractional order capacitor to a second voltage at a rate of discharge responsive to the input signal; producing a delayed signal, as a function of the complex impedance phase angle of said fractional order capacitor. Embodiment 43 is a method for adjusting a frequency response of a filter comprising a resistor and any one of the fractional order capacitors from any one of Embodiments 1 to 13, the method comprising the steps of: selecting a material weight percentage of a filler material in a dielectric nanocomposite layer of the fractional order capacitor to achieve a specified complex impedance phase angle; supplying an input voltage across a series combination of the fractional capacitor and a resistor; supplying an output voltage based on the voltage across the resistor; measuring a gain of the filter at a particular frequency; adjusting a capacitance of the fractional order capacitor according to the gain of the filter at the particular frequency by varying the complex impedance phase angle. Embodiment 44 is a method of operating a RF communications circuit comprising any one of the fractional order capacitors from any one of Embodiments 1 to 13, the method comprising the steps of: selecting a material weight percentage of a filler material in a dielectric nanocomposite layer of the fractional order capacitor to achieve a specified complex impedance phase angle; generating an RF signal at a resonant frequency; detecting a series resistance value of other components in the RF communications circuit; setting a negative resistance value of the fractional order capacitor to offset at least some of an equivalent series resistance value of other components in the RF communications circuit by varying the complex impedance phase angle.

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "coupled" is defined as connected, although not necessarily directly, and not necessarily mechanically.

The dielectric material, electrode layers, fractional order capacitor, and electronic devices of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the capacitors of the present invention is the ability to control the complex impedance angle of the capacitors.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description.

DETAILED DESCRIPTION OF THE INVENTION

An improved dielectric material for capacitors has been discovered that enables the realization of a fractional order capacitor. In particular, by combining a two-dimensional nanocomposite filler material, such graphene into a polymer matrix, and then varying the weight percentage of the filler material, the complex impedance phase angle of the capacitor can be varied, thus enabling the realization of a fractional order capacitor.

These and other non-limiting aspects of the present invention are discussed in further detail in the following sections.

A. Fractional Order Capacitor

Figure 1:
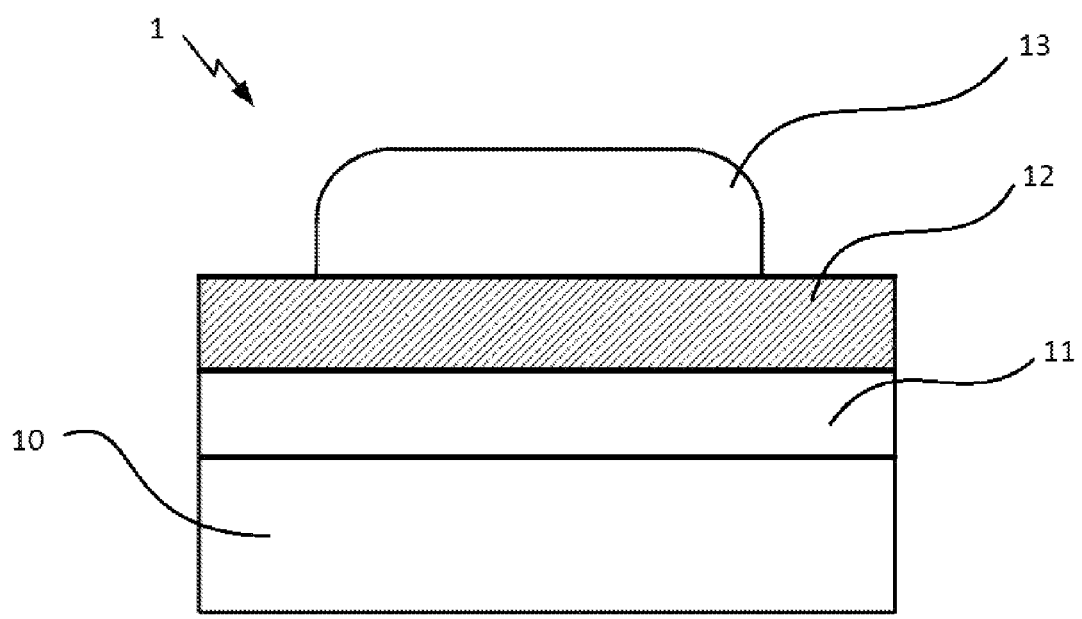
FIG. 1: Fractional order capacitor of the present invention.

FIG. 1 is a cross-sectional view of a fractional order capacitor of the present invention comprising a dielectric nanocomposite layer. The fractional order capacitor (1) can include a substrate (10), a lower electrode (11), a dielectric nanocomposite layer (12), and an end electrode (13). The fractional order capacitor can be fabricated on substrates by sandwiching a dielectric nanocomposite layer, which includes a polymer matrix and a two-dimensional nano-material, also described as filler material, between two conducting electrodes (11) and (13).

In contrast to standard capacitors with substantially integer-order impedances, the fractional order capacitor of the present invention can achieve phase angle shifts that are not restricted to the value of −90 degrees. For example, the fractional order capacitor could have phase angle shifts between those of a resistor and a capacitor, such as −0.5. As a result, this gives electrical designers more options in selecting the phase and energy storage/dissipation relationships for a particular need and thus allows for implementation into electrical circuits and methods that are not conventionally available.

1. Substrate (10)

The substrate (10) is used as support. Fractional order capacitors of the present invention can be fabricated using different substrates. Many additional substrate materials known to those of ordinary skill in the art can be used with the fractional order capacitor (1) of the present invention. Non-limiting examples of such materials include inorganic materials such as silicon, plastic, paper, etc. Other examples may include substrates based on SABIC polymers and their copolymers and blends including polyetherimides (such as ULTEM, EXTEM, SILTEM, poly (ethylene terephthalate), poly (butylene terephthalate), polycarbonates (such as LEXAN), poly (phenylene oxides), polyolefins, polystyrenes and poly (vinyl chlorides). Fractional order capacitors have been shown to perform equally as well as devices on silicon substrates and metal electrodes. The substrates are typically made from material that is not easily altered or degraded by heat or organic solvents.

2. Lower Electrode and Upper Electrodes (11) and (13)

The lower electrode (11) is made of a conductive material. Typically, the lower electrode (11) is obtained by forming a film using such a material (e.g., vacuum deposition, sputtering, ion-plating, plating, coating, etc.). Alternatively, the substrate may be coated with a thin layer of highly conducting polymer (poly(3,4-ethylenedioxythiophene):poly(styrene sulfonic acid), PEDOT:PSS Clevios PH-1000 (Heraeus) doped with ~4% Dimethylsulfoxide (DMSO)), serving as a bottom electrode. Other non-limiting examples of conductive material that can be used to form a conductive film include gold, platinum, silver, aluminum and copper, iridium, iridium oxide, and the like. In addition, non-limiting examples of conductive polymer materials include conducting polymers such as PEDOT: PSS, Polyaniline, graphene etc.) The thickness of the film for the lower electrode (11) is typically between 20 nm to 500 nm.

The upper electrode (13) can be disposed on the dielectric nanocomposite layer (12) by thermally evaporating using a shadow mask for patterning and probing. Top electrodes may also be patterned via inkjet printing of doped PH1000. Such capacitors have shown to perform equally as well as devices on silicon substrates and metal electrodes. The material used for the upper electrode (13) is also conductive, and is preferably aluminum. Non-limiting examples of such other materials include metals, metal oxides, and conductive polymers (e.g., polyaniline, polythiophene, etc.) such as those discussed above in the context of the lower electrode (11). The upper electrode (13) can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminium alloy, an indium-silver alloy, and a calcium-aluminum alloy. The film thickness of the upper electrode (13) is typically between 20 nm to 500 nm.

3. Dielectric Nanocomposite Layer (12)

Figure 2:
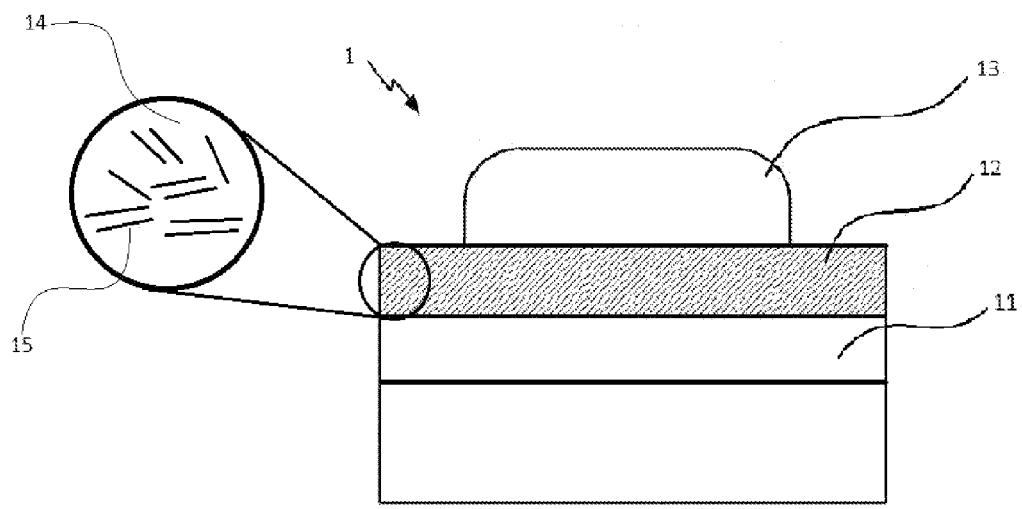
FIG. 2: Cross section showing filler material in the dielectric nanocomposite of the fractional order capacitor.

FIG. 2 is a cross section of the dielectric nanocomposite layer (12) interposed between the lower electrode (11) and the upper electrode (13). The dielectric nanocomposite layer (12) includes a filler material (15) and a polymer material (14). In one instance, the dielectric nanocomposite layer (12) can be a blend solution using graphene as the filler material, which may be un-oxidized or partially oxidized, and a polymer (14). The concentration of the graphene with the polymer (14) is between 0.1 wt % and 15 wt %. Nonlimiting examples of graphene synthesis include preparing Graphite oxide from graphite according to modified Hummer's method (DOI: 10.1021/ja01539a017) or exfoliating graphite oxide to form graphene oxide followed by hydrazine monohydrate reduction. (DOI:10.1016/j.carbon.2011.02.071).

The dielectric nanocomposite layer can be deposited by obtaining a solution that includes the polymers and the suspended filler material. The solution can be deposited by doctor blade coating, drop-casting, spin coating, meniscus coating, transfer printing, ink jet printing, offset printing, screen printing process, dip coating, casting, bar coating, roll coating, wire bar coating, spraying, screen printing, gravure printing, flexo printing, offset printing, gravure offset printing, dispenser coating, nozzle coating, capillary coating, etc.

B. Embodiment of Process for Producing Fractional Order Capacitor

With reference to FIG. 2, fractional order capacitor (1) is fabricated on a silicon substrate by disposing a dielectric nanocomposite layer (12) of a filler material (15) and a polymer (14) between two conducting electrodes. A Pt-coated silicon substrates can be used and cleaned with acetone, IPA and DI water prior to device fabrication. A 0.1 to 15 wt. % of graphene powder can be weighted according to a desired loading and then suspended in solution and ultrasonicated for 1-10 hours. The polymer (14) is added to the solution and stirred continuously. The Graphene/polymer solution is ultrasonicated four times from 1-300 min resulting in graphene suspension in polymer solution ready for casting.

The dielectric nanocomposite layer (12) solution can be deposited by drop casting and then left to dry for 1-24 hours. Air-dried films are transferred into a vacuum and dried for 1-48 hours. Top aluminum electrodes are thermally evaporated and patterned on the top surface of the films using a shadow-mask.

The process of the present invention can efficiently produce high-performance fractional order capacitors in quantity.

C. Applications for Fractional Order Capacitor

Capacitors are one of the crucial elements in integrated circuits and are used extensively in many electronic devices. The fractional order capacitor of the present invention could be used to implement electrical circuits and methods that are not conventionally available. This includes reducing the number of components required in a circuit, enhancing the resonant frequency of the circuit, allowing for more flexibility in shaping the frequency response of electronic filters, and enabling the realization of negative resistances and frequency dependent negative resistors. These latter benefits can be of extreme value and can open doors to electronics circuitries with more versatility.

Fractional order capacitors also provide energy-storing functionality. When a voltage is applied across the plates, the electric field in the dielectric displaces electric charges, and thus stores energy. The amount of energy stored by a fractional order capacitor depends on the dielectric constant of the insulating material, and the dimensions (total area and thickness) of the dielectric. The dielectric constant of the fractional order capacitor of the present invention can be varied by altering the amount and type of filler material. In order to maximize the total amount of energy that a capacitor can accumulate, the dielectric constant is maximized, and the thickness of the dielectric layer is minimized.

The fractional order capacitor disclosed above may also be employed in integrated circuits. For example, the fractional order capacitor may be part of a NAND or NOR gate in a logic device such as a microprocessor. Although specific circuitry has been set forth, it will be appreciated by those skilled in the art that not all of the disclosed circuitry is required to practice the disclosure. Moreover, certain well known circuits have not been described, to maintain focus on the disclosure.

Figure 3:
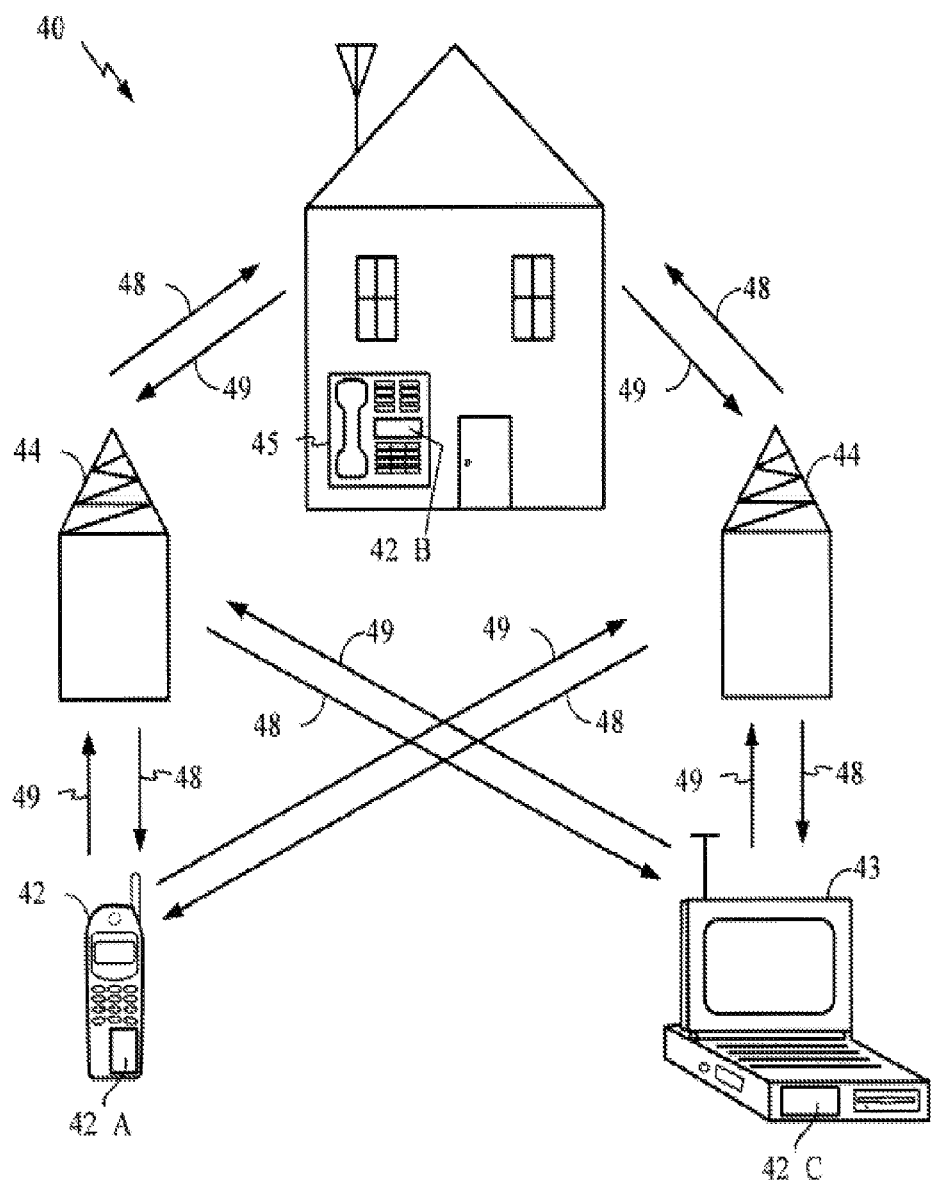
FIG. 3: Block diagram showing an exemplary wireless communication system in which a fractional order capacitor of the present invention may be advantageously employed.

FIG. 3 is a block diagram showing an exemplary wireless communication system 40 in which an embodiment of the disclosure may be advantageously employed. For purposes of illustration, FIG. 3 shows three remote units 42, 43, and 45 and two base stations 44. It will be recognized that wireless communication systems may have many more remote units and base stations. Remote units 42, 43, and 45 include circuit devices 42A, 42C and 42B, which may comprise integrated circuits or printable circuit boards, that include the disclosed fractional order capacitor. It will be recognized that any device containing an integrated circuit or printable circuit board may also include the fractional order capacitor disclosed here, including the base stations, switching devices, and network equipment. FIG. 3 shows forward link signals 48 from the base station 44 to the remote units 42, 43, and 45 and reverse link signals 49 from the remote units 42, 43, and 45 to base stations 44.

In FIG. 3, remote unit 42 is shown as a mobile telephone, remote unit 43 is shown as a portable computer, and remote unit 45 is shown as a fixed location remote unit in a wireless local loop system. For example, the remote units may be mobile phones, hand-held personal communication systems (PCS) units, portable data units such as personal data assistants, GPS enabled devices, navigation devices, set upper boxes, music players, video players, entertainment units, fixed location data units such as meter reading equipment, or any other device that stores or retrieves data or computer instructions, or any combination thereof. Although FIG. 3 illustrates remote units according to the teachings of the disclosure, the disclosure is not limited to these exemplary illustrated units. Embodiments of the disclosure may be suitably employed in any device which includes the fractional order capacitor 1.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Example 1

Figure 4:
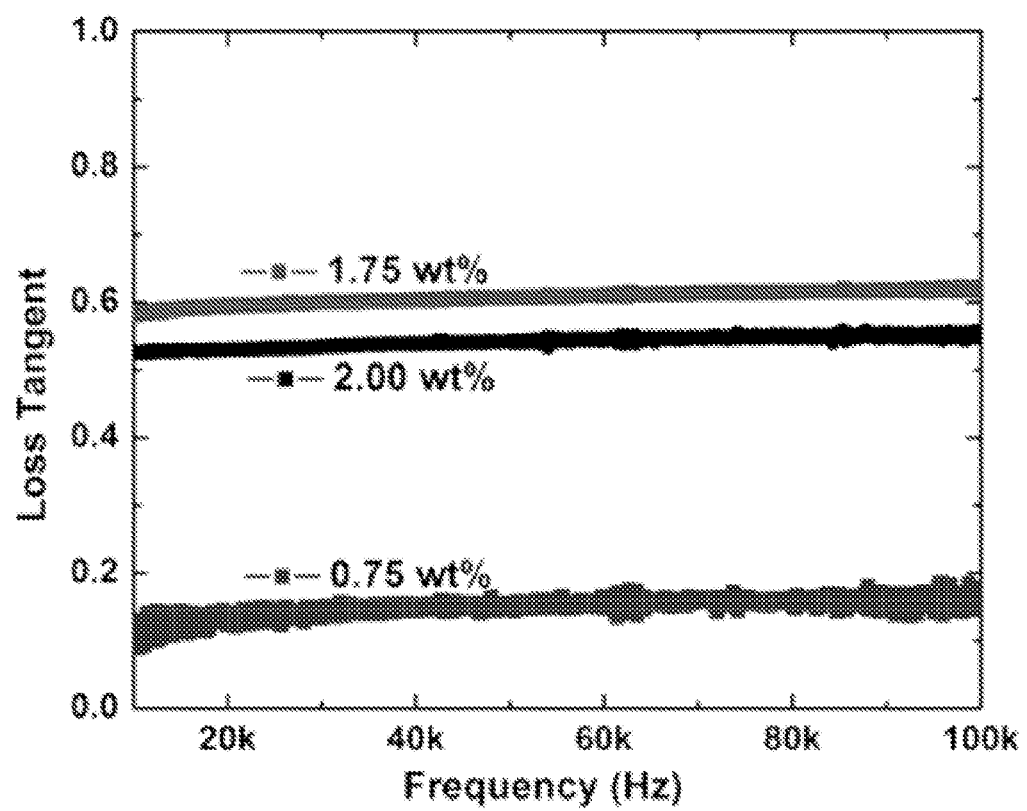
FIG. 4: P(VDF-TrFE-CFE) with graphene showing the loss tangent of the fabricated nanocomposite capacitor having a constant value throughout the measured frequency range.

P(VDF-TrFE-CFE) with Graphene Showing the Loss Tangent of the Fabricated Nanocomposite Capacitor Having a Constant Value Throughout the Measured Frequency Range A loss tangent test was carried out showing that the fractional capacitor exhibits a constant phase behavior with respect to frequency. Equivalently, a fractional capacitor would exhibit a constant loss tangent with respect to frequency (i.e. tan(loss tangent)+phase=90°). In the example, three samples with different loadings of graphene are shown and it is clearly observed that the loss tangent and/or phase are constant over a large frequency range. FIG. 4 also shows that the 2% and 1.75% loadings are more stable that the loading of 0.75%. (see FIG. 4)

Example 2

Figure 5:
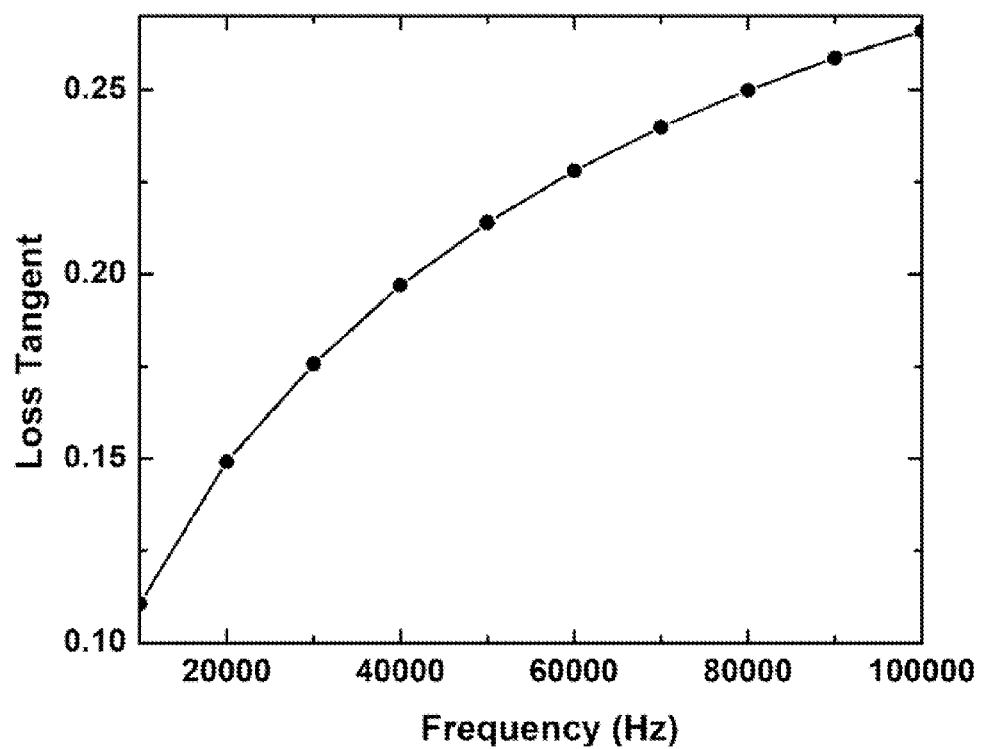
FIG. 5: P(VDF-TrFE-CFE) without graphene showing a large increase in the loss tangent value with increasing frequency between 10-100 kHz.

P(VDF-TrFE-CFE) without Graphene Showing a Large Increase in the Loss Tangent Value with Increasing Frequency Between 10-100 kHz To verify the unique results of the factional order capacitor of the present invention, additional loss tangent data from 3 other electrostatic capacitors was acquired. The selected films were: (1) P(VDF-TrFE-CFE) without graphene, (2) P(VDF-TrFE-CFE)+Polyaniline (PANI), and (3) Polystyrene. In these tests, the results showed a significant change in the loss tangent (~140% deviation) for a P(VDF-TrFE-CFE) polymer film between 10-100 kHz. This is primarily due to the absence of graphene sheets and thus the lack of formation of micro-capacitors. The stability in the loss tangent is clearly an effect of adding conductive graphene in the polymer matrix (see FIG. 5).

Example 3

Figure 6:
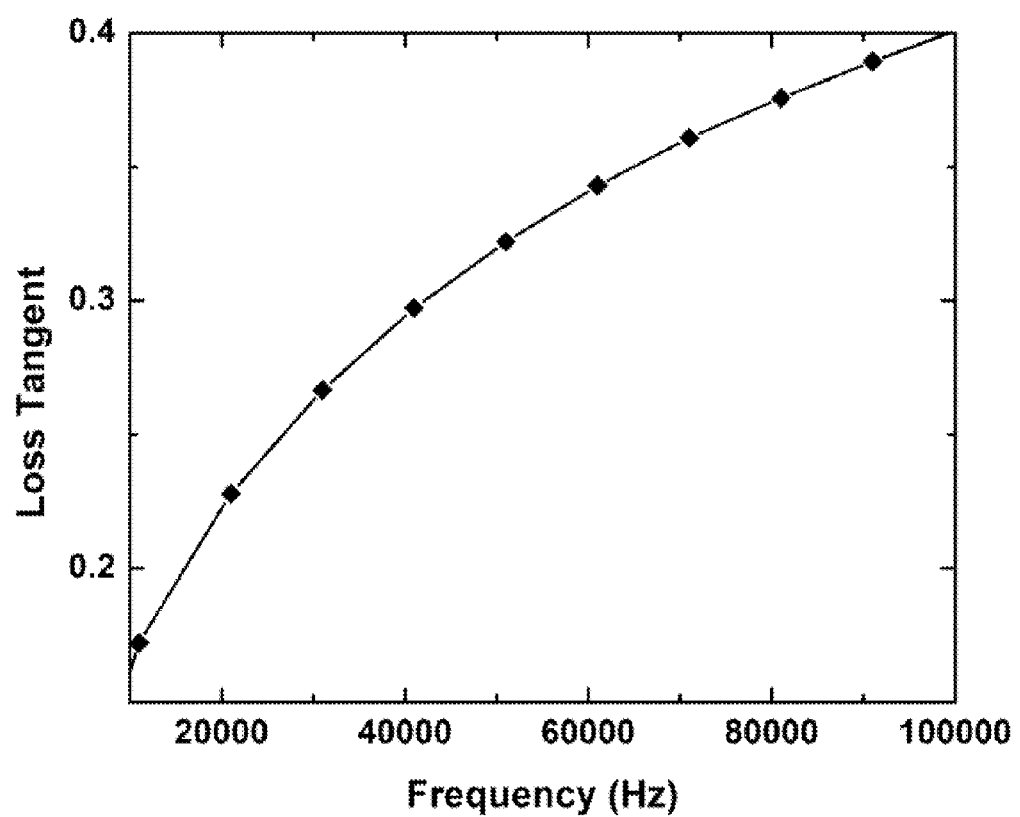
FIG. 6: P(VDF-TrFE-CFE)/Polyaniline nanocomposite showing a large increase in the loss tangent value with increasing frequency between 10-100 kHz.

P(VDF-TrFE-CFE)/Polyaniline Nanocomposite Showing a Large Increase in the Loss Tangent Value with Increasing Frequency Between 10-100 kHz An additional test was carried out using a different composite system, P(VDF-TrFE-CFE) was filled with conductive PANI particles. In FIG. 6, the performance of these films clearly shows a large variation in the loss tangent (>130%) within the same selected frequency range. Although this is a percolative composite, relative to graphene sheets, PANI particles have much lower aspect ratios and are incapable of resembling microcapacitor structuring required for RC network simulation.

Example 4

Figure 7:
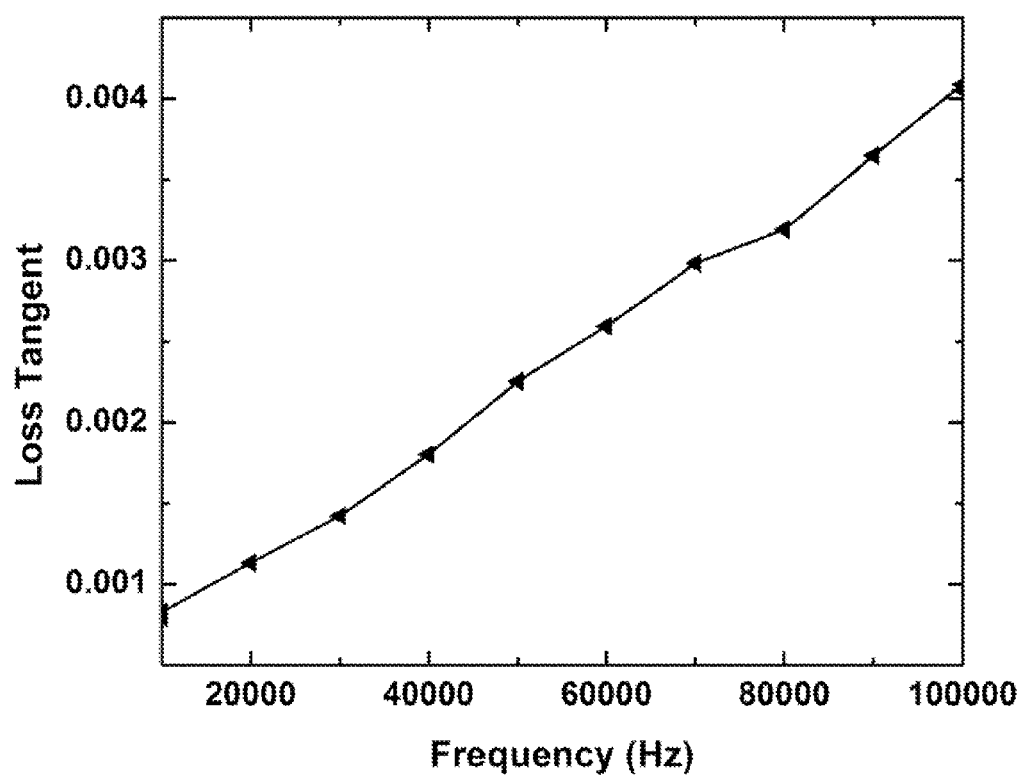
FIG. 7: Polystyrene showing a large increase in the loss tangent value with increasing frequency between 10-100 kHz.

Polystyrene Showing a Large Increase in the Loss Tangent Value with Increasing Frequency Between 10-100 kHz A conventional capacitor film of polystyrene was also been tested in FIG. 7. Compared to the above capacitor tests, although the loss tangent values are about 3 orders of magnitude lower, polystyrene displays the largest deviation in the loss (>400%).

The invention claimed is:

1. A fractional order capacitor comprising:
    a dielectric nanocomposite layer of thickness t, comprising a first side, and a second side opposite the first side, wherein the dielectric layer comprises a polymer nanocomposite comprising conductive filler material dispersed within a dielectric polymer matrix to form microcapacitors with the dielectric polymer matrix;
    a first electrode layer coupled to the first side of the dielectric nanocomposite layer; and
    a second electrode layer coupled to the second side of the dielectric nanocomposite layer,
    wherein the micro-capacitors are configured to inject a complex impedance phase angle in an electrical signal propagating from the first electrode layer to the second electrode layer through the dielectric layer.

2. The fractional order capacitor of claim 1 where the conductive filler material is graphene.

3. The fractional order capacitor of claim 2 where the graphene is partially oxidized.

4. The fractional order capacitor of claim 2 where the graphene is completely un-oxidized.

5. The fractional order capacitor of claim 2 where the material weight percentage of the graphene comprises between about 0.1% and 15%, based upon the total weight of the dielectric nanocomposite layer.

6. The fractional order capacitor of claim 1 where the first and second electrode layers comprise a conducting material.

7. The fractional order capacitor of claim 6 where the first electrode layer comprises platinum and the second electrode layer comprises aluminum.

8. The fractional order capacitor of claim 6 where the first and second electrode layers comprise PEDOT:PSS.

9. The fractional order capacitor of claim 1 where the complex impedance phase angle is between 0° and −90°.

10. The fractional order capacitor of claim 1 comprising a loss tangent approximately constant with respect to frequency of the electrical signal.

11. The fractional order capacitor of claim 1 wherein the fractional order capacitor exhibits fractional behavior for frequencies between 10kHz and 2MHz.

12. The fractional order capacitor of claim 1 comprised in a printed circuit board.

13. The fractional order capacitor of claim 12 where the fractional order capacitor comprises at least a portion of a communications circuit.

14. The fractional order capacitor of claim 12 where the fractional order capacitor comprises at least a portion of a sensing circuit.

15. The fractional order capacitor of claim 12 where the fractional order capacitor comprises at least a portion of a control circuit.

16. The fractional order capacitor of claim 1 comprised in an integrated circuit.

17. The fractional order capacitor of claim 16 where the fractional order capacitor comprises at least a portion of a communications circuit.

18. The fractional order capacitor of claim 1 comprised in an electronic device.

19. A method of manufacturing a fractional order capacitor, comprising:
    obtaining a first electrode layer;
    selecting a material weight percentage of a conductive filler material in a polymer nanocomposite of a dielectric nanocomposite layer to form micro-capacitors with the dielectric nanocomposite layer and achieve a specified complex impedance phase angle;

disposing the dielectric nanocomposite layer on the first electrode layer; and disposing a second electrode layer on the dielectric nanocomposite layer so that the dielectric nanocomposite layer is disposed between the first electrode layer and the second electrode layer.

20. A method of operating a delay circuit to impose a selected delay on an electrical signal with the fractional order capacitors from claim 1, the method comprising the steps of:

selecting a material weight percentage of a conductive filler material in a polymer nanocomposite of a dielectric nanocomposite layer of the fractional order capacitor to form micro-capacitors with the dielectric nanocomposite layer and achieve a specified complex impedance phase angle;

charging said fractional order capacitor to a first voltage at a rate of charge responsive to the input signal;

discharging said fractional order capacitor to a second voltage at a rate of discharge responsive to the input signal; and producing a delayed signal, as a function of the complex impedance phase angle of said fractional order capacitor.

21. The fractional order capacitor of claim 1, wherein the complex impedance phase angle is dependent on at least a material weight percentage of the conductive filler material in the dielectric nanocomposite layer.

* * * * *